United States Patent [19]
Howell et al.

[11] Patent Number: 5,761,472
[45] Date of Patent: Jun. 2, 1998

[54] INTERLEAVING BLOCK OPERATIONS EMPLOYING AN INSTRUCTION SET CAPABLE OF DELAYING BLOCK-STORE INSTRUCTIONS RELATED TO OUTSTANDING BLOCK-LOAD INSTRUCTIONS IN A COMPUTER SYSTEM

[75] Inventors: Stephen Howell, Santa Clara; Robert Yung, Fremont, both of Calif.

[73] Assignee: Sun Microsystems, Inc., Palo Alto, Calif.

[21] Appl. No.: 560,615

[22] Filed: Nov. 20, 1995

Related U.S. Application Data

[63] Continuation-in-part of Ser. No. 208,987, Mar. 9, 1994, abandoned.

[51] Int. Cl.[6] .............................. G06F 9/30; G06F 12/00; G06F 13/00
[52] U.S. Cl. .......................... 395/390; 395/380; 395/484
[58] Field of Search ..................... 395/442, 443, 395/448, 493, 405, 454, 484, 552, 380, 390–395

[56] References Cited

U.S. PATENT DOCUMENTS

| 5,455,918 | 10/1995 | Fowler et al. | 395/825 |
| 5,475,823 | 12/1995 | Amerson et al. | 395/496 |
| 5,504,869 | 4/1996 | Uchida | 395/390 |

*Primary Examiner*—Matthew M. Kim
*Attorney, Agent, or Firm*—Kang S. Lim

[57] ABSTRACT

A computer system which includes a processor having an instruction set capable of "delaying" block-store instructions related to any outstanding block-load instruction(s). Accordingly, a method for interleaving block data transfers and processing steps which exploits the characteristics of the instruction set and architecture of the processor in order to increase efficiency and throughput of the computer system is provided. Hence by interleaving the block-store instruction of the previous data block with the block-load instruction of the next data block, the entire block transfer process can be streamlined.

6 Claims, 3 Drawing Sheets

5,761,472

INTERLEAVING BLOCK OPERATIONS EMPLOYING AN INSTRUCTION SET CAPABLE OF DELAYING BLOCK-STORE INSTRUCTIONS RELATED TO OUTSTANDING BLOCK-LOAD INSTRUCTIONS IN A COMPUTER SYSTEM

RELATED APPLICATIONS

The present application is a continuation-in-part of U.S. patent application Ser. No. 08/208,987, filed on Mar. 9, 1994, now abandoned, hereby incorporated by reference.

BACKGROUND OF THE INVENTION

1. Field of the Invention

This invention relates to the efficient execution of block operations in a computer system. More particularly, the present invention relates to an efficient method and apparatus for interleaving the transfer and processing of data blocks in a computer system.

2. Description of the Related Art

With the proliferation of realtime graphics applications in computer systems, the need for these computer systems to transfer and process blocks of data quickly and efficiently has increased rapidly. FIG. 1 is a flowchart illustrating a conventional method for serially transferring and processing data blocks in one such computer system having a processor and a main memory coupled to each other by a system bus.

First, source and destination block pointers and a block counter n are initialized (step 1010). The source and destination block pointers are pointers for locating the source and destination data blocks, respectively. An nth block of data can now loaded, e.g., from the main memory to a local memory of the processor (step 1020). When the nth block of data has been loaded, the nth block of data is processed (step 1030). Processing can range from relatively simple translations, e.g., for moving a "window", to the more computationally intensive operations such as rotations.

The nth block of data is then stored, e.g., written back to the main memory (step 1040). The block counter n is incremented (step 1050). If n is not greater than the total number of blocks to be transferred (step 1060), steps 1020 through 1050 are repeated. Note that since the processor is responsible for orchestrating and controlling all the above steps, the processor is not available for executing any unrelated instructions, for example, during the transfer of the data blocks to and from the main memory. As such, the above described steps are essentially serial in nature and thus inefficient.

One related method for increasing the efficiency of the computer system is direct memory access (DMA). In a conventional DMA-based computer system, a dedicated DMA controller capable of independently transferring data is provided so that the processor of the computer system can freed up for executing other unrelated instructions while the transfer of data block(s) is taking place. Accordingly, when the DMA-based computer system needs to process a block of data, a DMA block transfer is initiated in the following exemplary manner.

First, the processor sends the source block pointer, the destination block pointer and the data block size to the DMA controller. The DMA controller is now able to begin transferring the block of data, e.g. from the main memory to the local memory. Since the processor is not involved with the actual transfer of the data block, the processor is now free execute other unrelated instructions, subject to the sharing of the data and address lines of the system bus with the DMA operation.

When the DMA block transfer is complete, the DMA controller issues an interrupt to the processor, indicating that the DMA transfer has completed and processing of the transferred data block by the processor can begin. Alternatively, the processor can execute a delay loop long enough to ensure that the DMA block transfer has completed.

Subsequently, when the processing of the transferred data block is complete, the DMA controller can be reinitialized to store the data block, e.g., back to the main memory, in a manner described above for the first DMA block transfer.

Although, the above-described DMA-based computer system is more efficient in that the processor is not idle while data block transfers are taking place, the total amount of time required for transferring and processing the data block (s) has not changed significantly since the data transferring and processing steps are essentially serial in nature. In addition, DMA controllers are incapable of performing any processing beyond simple block transfers of data.

Hence there is a need for a method and apparatus for interleaving transfers and processing steps which exploits the characteristics of the instruction set and architecture of the processor in order to increase efficiency and throughput of the computer system.

SUMMARY OF THE INVENTION

The present invention provides a computer system which includes a processor having an instruction set capable of "delaying" block-store instructions related to any outstanding block-load instruction(s). Accordingly, a method for interleaving block data transfers and processing steps which exploits the characteristics of the instruction set and architecture of the processor in order to increase efficiency and throughput of the computer system is provided.

In one embodiment, the instruction interleaving algorithm include the following steps. First, a block counter n is initialized. A first block-load instruction for loading the initial block of data, i.e. the nth block of data, is issued. Another block-load instruction for loading the next block of data, i.e., the (n+i)th block, is then issued. "i" is an integer.

Since the processor has access to the nth block of data, any additional processing can be accomplished at or shortly after load time. For example, the nth block may need to be re-aligned with respect to its block boundary.

A block-store instruction is then issued to store the processed nth block of data. In accordance with one aspect of the invention, if the processor has not completed the execution of any outstanding block-load instruction related to the nth block of data, e.g., the block-load instruction for loading the nth block of data, then the processor delays the block-store instruction of the nth block of data until the execution of the outstanding block-load instruction for loading the nth block of data has been completed.

The block counter n is advanced by i and the interleaved block load/store cycle is repeated until all the data blocks have been transferred and if needed, processed. Hence by interleaving the block-store instruction of the previous data block with the block-load instruction of the next data block, the entire block transfer process can streamlined.

DESCRIPTION OF THE DRAWINGS

The objects, features and advantages of the system of the present invention will be apparent from the following description in which.

DETAILED DESCRIPTION OF THE INVENTION

In the following detailed description, numerous details provide a thorough understanding of the present invention. These details include functional blocks and flowcharts to assist one in incorporating instruction interleaving in a wide variety of computer applications and computer systems. In addition, while the interleaving technique is described with reference with specific implementations, the invention is applicable to a wide variety of instruction sets and system architectures. In other instances, well-known structures and algorithms are not described in detail so as not to obscure the invention unnecessarily.

Figure 1:
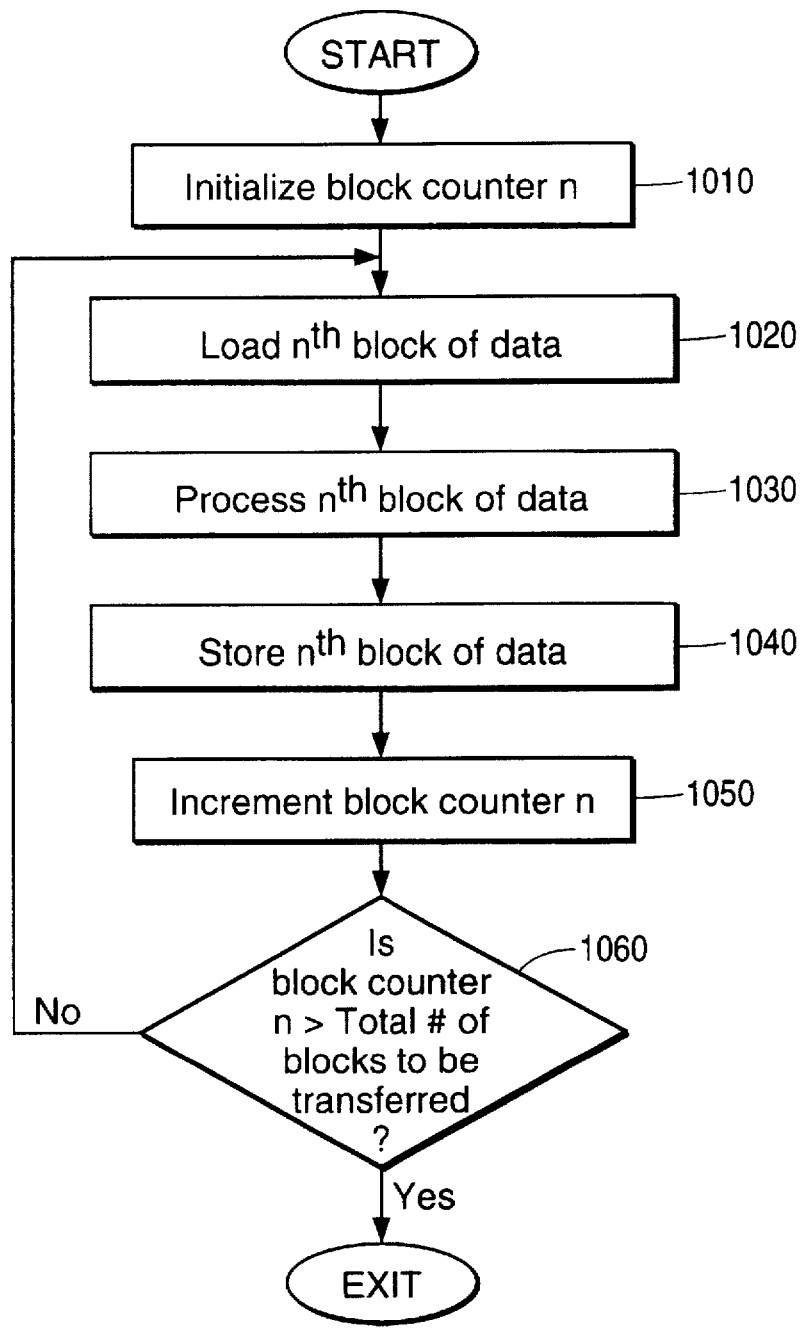
FIG. 1 is a flowchart illustrating a conventional method for serially transferring and processing data blocks in a computer system.
Figure 2:
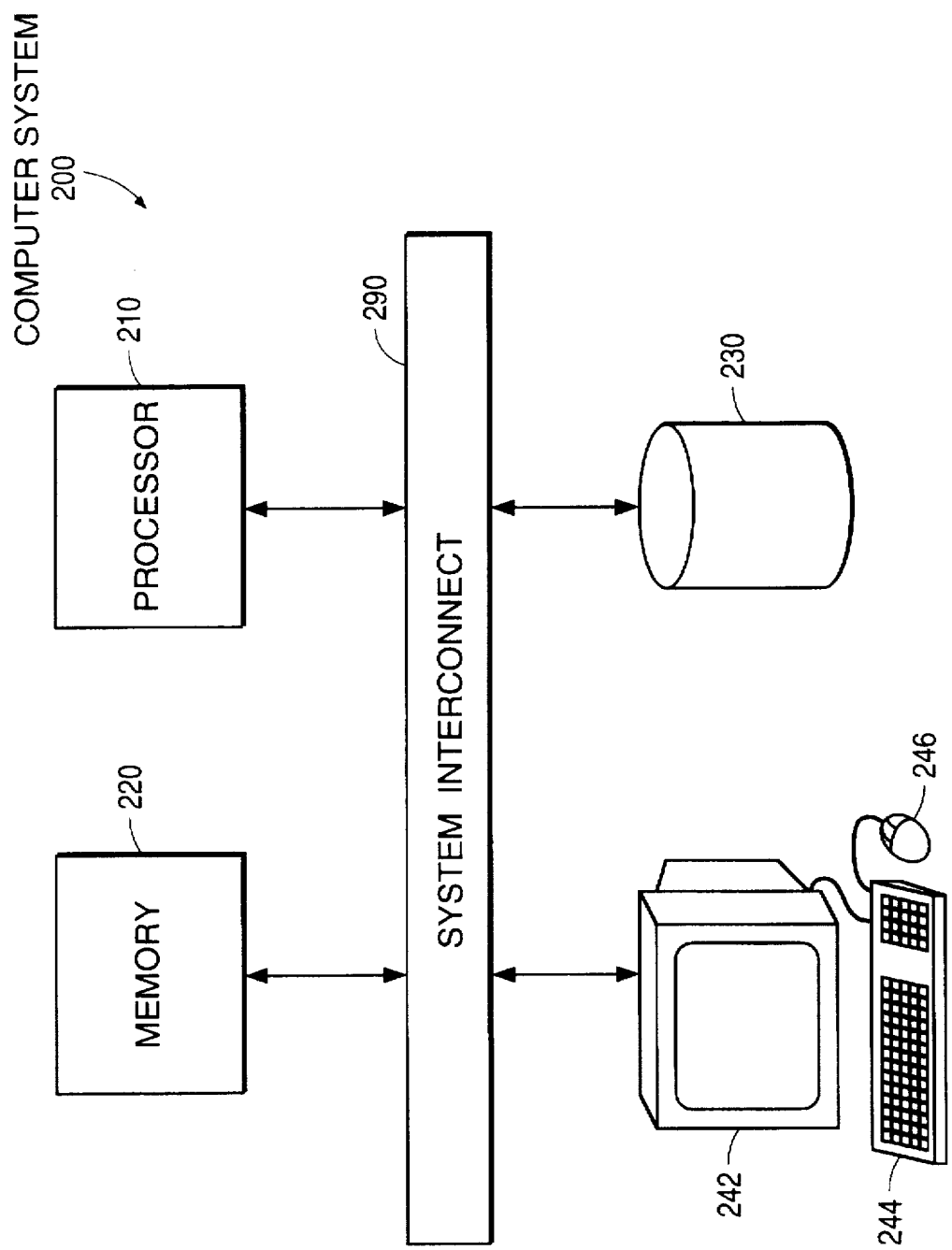
FIG. 2 is a block diagram of one embodiment of the present invention.

As shown in FIG. 2, a block diagram of one embodiment of the present invention, instruction interleaving is implemented in a computer system 200 which includes a processor 210, a memory 220, a disk drive 230, a display device 242, a keyboard 244 and a mouse 246, coupled to each other by a system interconnect 290. Suitable architectures for implementing system interconnect 290 include bus-based and switch-based architectures. In addition, processor 210 may be a SPARC RISC processor or any other suitable microprocessor.

In accordance with one aspect of the invention, processor 210 has a visual instruction set (VIS) which includes block transfer instructions such as block-load and block-store instructions. An exemplary VIS is disclosed in pending U.S. patent application Ser. No. 08/236,572, referenced above. The delayed block-store mechanism is described in detail in U.S. patent application Ser. No. 08/208,987, referenced above.

The block transfer instructions are useful for moving large blocks of data with a single instruction. One advantageous characteristic of computer system 200 is that when processor 210 has not completed execution of an outstanding block-load instruction related to a block of data, processor 210 interlocks, i.e., delays the execution of, any block-store instruction(s) related to the outstanding block-load instruction, e.g., a block-load instruction to the same data block, by suspending the execution of the (issued later-in-time) block-store instruction(s) until the execution of the outstanding block-load instruction has completed.

Figure 3:
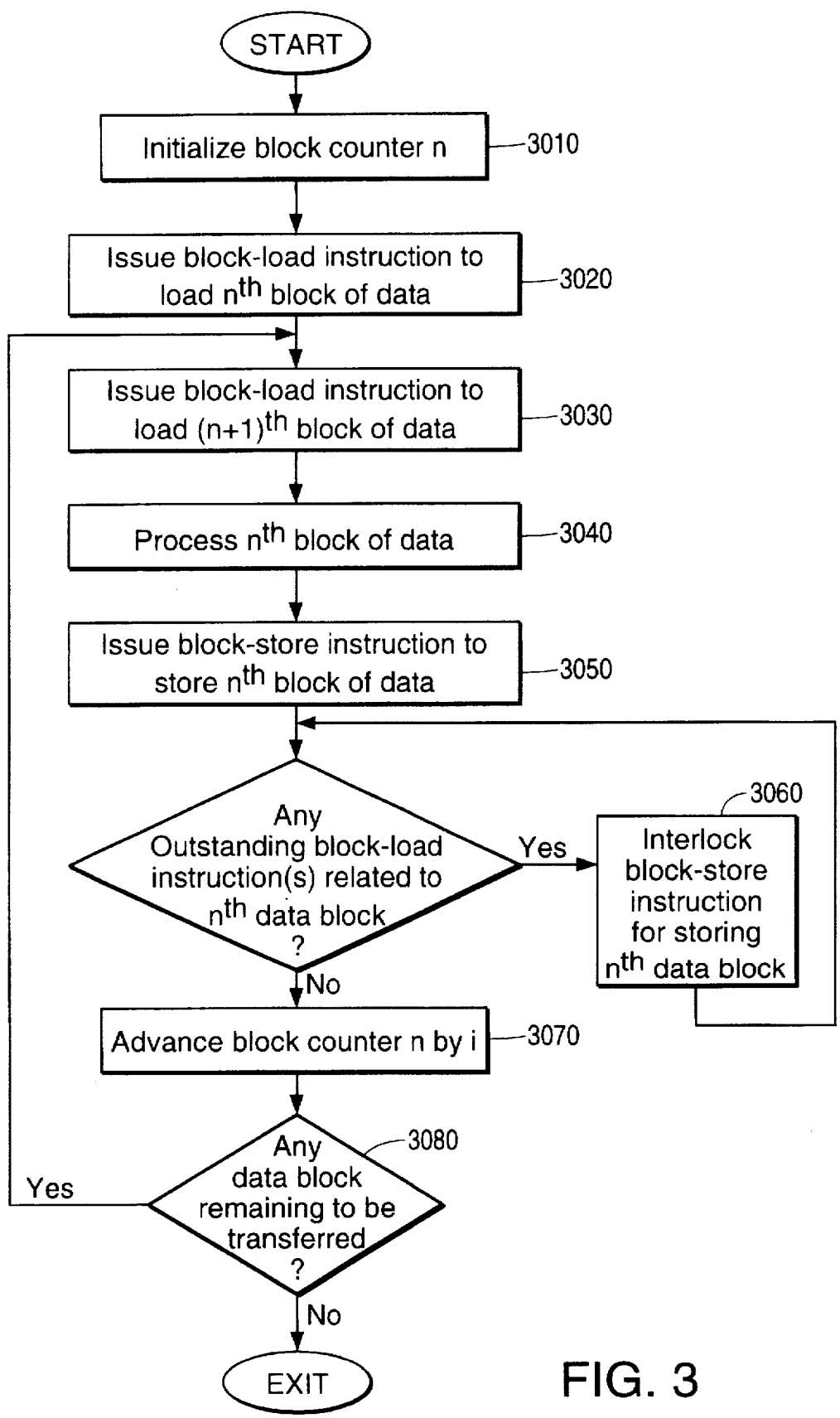
FIG. 3 is a flowchart illustrating one implementation of instruction interleaving in the computer system of the present invention.

In one implementation, the instruction interleaving algorithm exploits the above described interlocking characteristic of processor 210. Referring now to the flowchart of FIG. 3, first, a block counter n is initialized (step 3010). A first block-load instruction for loading the initial block of data, i.e., the nth block of data, is issued to processor 210 (step 3020).

Another block-load instruction for loading the next block of data, i.e., the (n+i)th block, is then issued to processor 210 (step 3030). "i" is a suitable integer. Since processor 210 has access to the nth block of data upon loading, any processing can be accomplished at or shortly after load time (step 3040). Processing is can be a simple re-align, or any other graphics operation(s) including but not limited to rotation, translation, scaling and transposition.

For example, in a window-based user interface for an operation system, a common operation is the translation of moving "windows" around display device 242. Depending on the direction of the translation of the "window" required, the data transfer may begin from the top to the bottom and the left to the right, relative to display device 242.

A block-store instruction is then issued to store the processed nth block of data (step 3050). In accordance with one aspect of the invention, if processor 210 has not completed the execution of any outstanding block-load instruction related to the nth block of data, e.g., the block-load instruction for loading the nth block of data, then processor 210 interlocks, i.e., delays the execution of, the block-store instruction of the nth block of data until the execution of the outstanding block-load instruction for loading the nth block of data has been completed (step 3060).

The block counter n is advanced by i (step 3070). Depending on the implementation, several methods for advancing the block counter n and hence the related block pointers of processor 210 is possible. For example, the block counter n can be incremented or decremented.

If there are data block(s) remaining to be processed, step 3030 through step 3080 are repeated until all the data blocks have been transferred and if needed, processed (step 3080).

Hence by interleaving the block-store of the previous data block with the block-load of the next data block, the entire block transfer and/or process is streamlined.

The above description is merely illustrative of the invention. Modifications and additions are possible without departing from the invention. Thus the present invention should be limited only by the following claims.

What is claimed is:

1. A method for interleaving instructions in a computer system having a processor, a memory and an instruction set which includes a plurality of block transfer instructions such as block-load instructions and block-store instructions, said method comprising the steps of:

a) initializing a block counter n of the computer system;

b) issuing a block-load instruction to load an nth block of data from the memory;

c) issuing another block-load instruction to load an (n+i)th block of data from the memory, wherein i is an integer;

d) processing the nth block of data;

e) issuing a block-store instruction to store the nth block of data to the memory;

f) if the processor has not completed the execution of any outstanding block-load instruction related to the nth block of data, then the processor delays the execution of the block-store instruction of step e) until the execution of said any outstanding block-load instruction has been completed;

g) advancing the block counter n by i; and h) if there are block(s) remaining to be transferred, then repeating steps c) through h).

2. The method of claim 1 wherein the instruction set is a visual instruction set (VIS).

3. The method of claim 1 wherein the processing step d) includes a block re-align step.

4. A computer program product which includes computer-usable medium having computer-readable code embodied therein for causing instruction interleaving in a computer system having a processor, a memory and an instruction set which includes block transfer instructions such as block-load instructions and block-store instructions, the computer program product comprising:

a) computer-readable program code devices configured to initialize a block counter n of the computer system;

b) computer-readable program code devices configured to issue a block-load instruction to load an nth block of data from the memory;

c) computer-readable program code devices configured to issue another block-load instruction to load an (n+i)th block of data from the memory, wherein i is an integer;

d) computer-readable program code devices configured to process the nth block of data;

e) computer-readable program code devices configured to issue a block-store instruction to store the nth block of data to the memory;

f) computer-readable program code devices configured to cause the processor to delay the execution of the block-store instruction of step e) if the processor has not completed executing any outstanding block-load instruction related to the nth block of data;

g) computer-readable program code devices configured to advance the block counter n by i; and h) computer-readable program code devices configured such that if there are block(s) remaining to be transferred, then the program code devices of h) will cause the computer system to re-execute program code devices c) through h).

5. The computer program product of claim 4 wherein the instruction set is a visual instruction set (VIS).

6. The computer program product of claim 4 wherein the computer-readable program code devices of element d) includes program code devices for re-aligning the nth block of data.

* * * * *

UNITED STATES PATENT AND TRADEMARK OFFICE
CERTIFICATE OF CORRECTION

PATENT NO.    : 5,761,472
DATED         : June 2, 1998
INVENTOR(S)   : Stephen Howell et al.

It is certified that error appears in the above-identified patent and that said Letters Patent is hereby corrected as shown below:

<u>Title page,</u>
Item [75], add inventor -- Raymond M. Roth --.

Signed and Sealed this

Twenty-fourth Day of December, 2002

JAMES E. ROGAN
*Director of the United States Patent and Trademark Office*